(12) United States Patent
Boo et al.

(10) Patent No.: US 11,710,722 B2
(45) Date of Patent: Jul. 25, 2023

(54) SEMICONDUCTOR ASSEMBLIES WITH SYSTEMS AND METHODS FOR MANAGING HIGH DIE STACK STRUCTURES

(71) Applicant: Micron Technology, Inc., Boise, ID (US)

(72) Inventors: Kelvin Tan Aik Boo, Singapore (SG); Seng Kim Ye, Singapore (SG); Chin Hui Chong, Singapore (SG); Hong Wan Ng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/233,129

(22) Filed: Apr. 16, 2021

(65) Prior Publication Data

US 2022/0336419 A1 Oct. 20, 2022

(51) Int. Cl.
*H01L 25/065* (2023.01)
*H01L 23/498* (2006.01)
*H01L 23/00* (2006.01)
*H01L 25/00* (2006.01)

(52) U.S. Cl.
CPC ...... *H01L 25/0657* (2013.01); *H01L 23/4985* (2013.01); *H01L 24/48* (2013.01); *H01L 25/50* (2013.01); *H01L 2224/48147* (2013.01); *H01L 2224/48227* (2013.01); *H01L 2225/0651* (2013.01); *H01L 2225/06506* (2013.01); *H01L 2225/06562* (2013.01); *H01L 2225/06572* (2013.01)

(58) Field of Classification Search
CPC ............ H01L 2225/06572; H01L 2225/06562
See application file for complete search history.

(56) References Cited

U.S. PATENT DOCUMENTS

| | | | | |
|---|---|---|---|---|
| 2005/0280138 A1* | 12/2005 | Shrivastava | ........ | H01L 23/5387 257/E23.079 |
| 2010/0181661 A1* | 7/2010 | Takemoto | ............... | H01L 24/73 257/E23.141 |
| 2019/0198411 A1* | 6/2019 | Horikawa | ........... | H01L 23/5387 |

* cited by examiner

*Primary Examiner* — Yu-Hsi D Sun
(74) *Attorney, Agent, or Firm* — Perkins Coie LLP

(57) ABSTRACT

A semiconductor device includes a rigid flex circuit that has a first rigid region and a second rigid region that are electrically connected by a flexible portion. A first die is mounted to a first side of the first rigid region. A second die is mounted to a second side of the second rigid region. The first and second sides are on opposite sides of the rigid flex circuit. The flexible portion is bent to hold the first and second rigid regions in generally vertical alignment with each other.

20 Claims, 13 Drawing Sheets

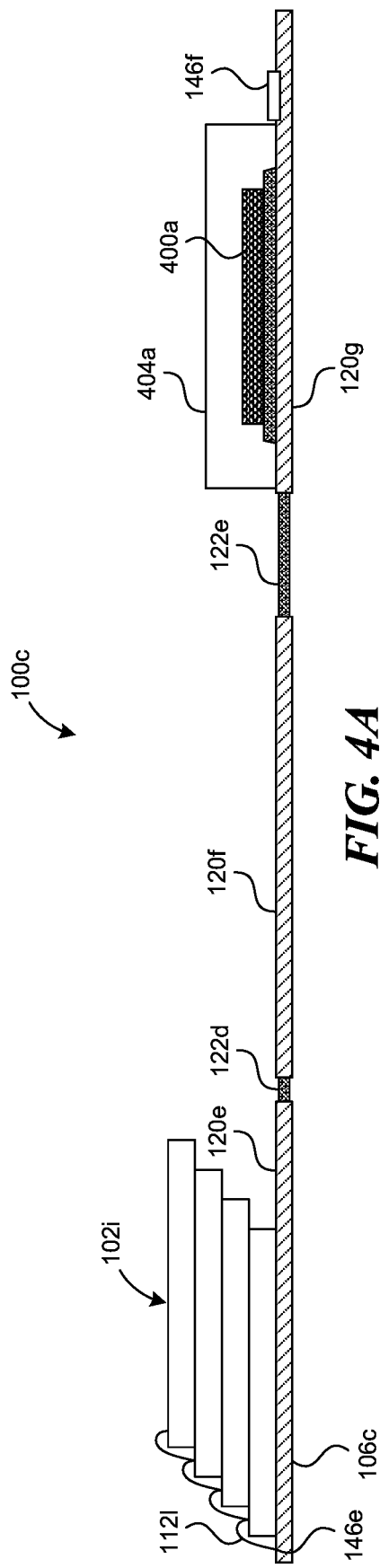
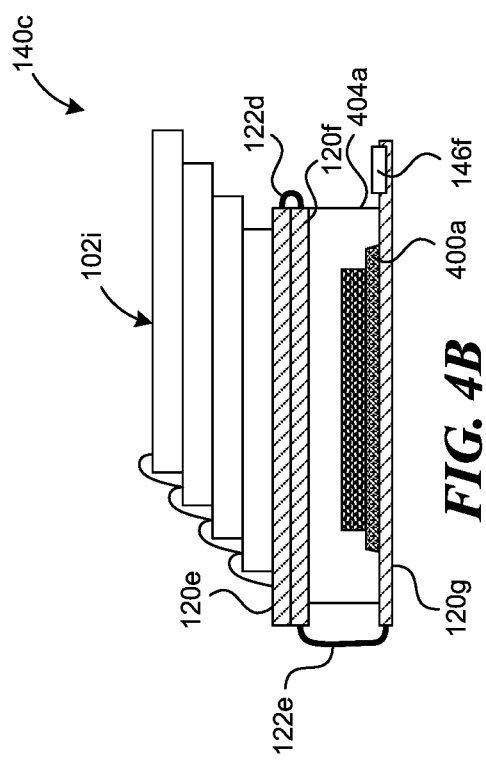

SEMICONDUCTOR ASSEMBLIES WITH SYSTEMS AND METHODS FOR MANAGING HIGH DIE STACK STRUCTURES

TECHNICAL FIELD

The present technology is directed to semiconductor device packaging. More particularly, some embodiments of the present technology relate to structures and techniques for attaching high die stack structures to the substrate.

BACKGROUND

Packaged semiconductor dies, such as memory chips, microprocessor chips, and imaging chips, typically include a semiconductor die mounted on a substrate and encased in a protective covering. The semiconductor die can include functional features, such as memory cells, processor circuits, and imager devices.

Market pressures continually drive semiconductor manufacturers to reduce the size of die packages to fit within the space constraints of electronic devices, while also driving them to increase the functional capacity of each package to meet operating parameters. One approach for increasing the processing power of a semiconductor package without substantially increasing the surface area covered by the package (the package's "footprint") is to vertically stack multiple semiconductor dies on top of one another in a single package. The dies in such vertically-stacked packages can be electrically coupled to each other and/or to a substrate via electrical connectors, interconnects, or other conductive structures. However, as the number of electrical connectors connecting the stacked dies to the substrate increases, the area needed to attach the electrical connector bonds also increases, thus decreasing the room available for other components and connections. Also, it can become increasingly difficult to keep the electrical connectors separate from each other.

BRIEF DESCRIPTION OF THE DRAWINGS

Many aspects of the present technology can be better understood with reference to the following drawings. The components in the drawings are not necessarily to scale. Instead, emphasis is placed on illustrating the principles of the present technology.

FIG. 4A is a cross-sectional view of a die stack and a controller die mounted on a rigid flex circuit in accordance with embodiments of the present technology.

FIG. 4B is a cross-sectional view of the assembly of FIG. 4A that has been bent to position the die stack over the controller die in accordance with embodiments of the present technology.

DETAILED DESCRIPTION

Figure 1A:
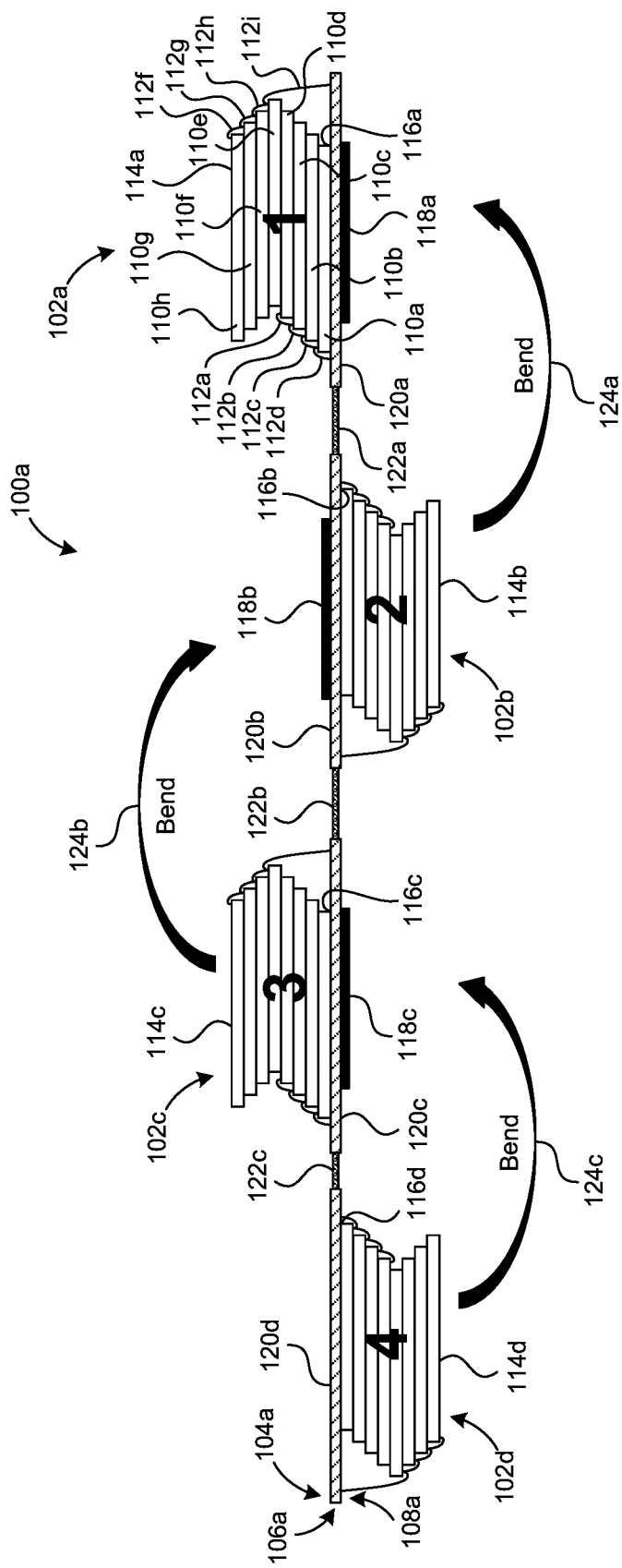
FIG. 1A is a cross-sectional view of a plurality of die stacks that are attached to a rigid flex circuit in accordance with embodiments of the present technology.

Specific details of several embodiments of semiconductor devices are described below. In some embodiments, a plurality of die stacks can be mounted (e.g., attached) to rigid regions of a rigid flex circuit. As described herein, a die stack can include a single die or more than one die. The rigid flex circuit can be a laminated structure that includes one or more inner layers that can convey signals. Electrical connectors (e.g., bond wires, solder interconnects, etc.) can connect some of the dies within a die stack to each other and to a wire bond connection on the rigid flex circuit that is in communication with an appropriate signal conveying layer. The rigid regions of the rigid flex circuit can alternate with flexible portions that allow the rigid flex circuit to be bent, such as by flexing the flexible portions approximately 180 degrees, to generally vertically align at least some of the attached die stacks with each other. In some cases, a spacer (e.g., attached to a die stack and/or the rigid flex circuit) can be used to separate a top side of a die stack or other component from the rigid flex circuit when the assembly is generally or approximately in vertical alignment. Either one of the die stacks or one of the rigid regions of the vertically aligned assembly can be attached to a substrate. Electrical connectors can connect the rigid flex circuit and the substrate to convey the signals associated with the plurality of die stacks to and/or from the substrate.

Using the rigid flex circuit to form the vertically aligned assembly of die stacks allows shorter wires to be used which can contribute to a cost benefit. The shorter wires can also reduce common wire sweeping and/or shorting issues that can occur during the assembly process. In addition, fewer individual electrical connectors need to be connected to the substrate. Therefore, less space is needed on the substrate for electrical connection and more components can be included within the same footprint. An additional benefit can be realized by applying impedance control for differential signal/high speed signal on the rigid flex circuit to improve signal integrity by reducing wire to wire signal cross-talk and interference.

In some cases, other components, such as, but not limited to, a controller die, can be mounted to a rigid region of the rigid flex circuit. The controller die can be molded after attachment or pre-molded. A vertically aligned assembly can be formed by bending one or more flexible portions to position die stack(s) attached to the rigid flex circuit over the controller die. In other embodiments, the rigid flex circuit can be used in side-by-side configurations wherein one or more dies stacks attached to the rigid flex circuit can be positioned over a die stack or other component mounted on the substrate proximate to the rigid flex circuit. This can provide increased capacity within the same footprint by utilizing open space above mounted components, and/or increasing capacity while keeping the overall height of die stacks and/or vertically aligned assemblies within desired limits and/or ranges.

In some embodiments, the die stacks can be formed on the rigid flex circuit, while in other embodiments, the die stacks can be pre-formed and then mounted on the rigid flex circuit. The electrical connections between the dies, the die stacks, and the rigid flex circuit can be accomplished prior to bending the rigid flex circuit, or iteratively, such as between different multiple bending operations. Some of the die stacks and/or components can be attached to a first side of the rigid flex circuit and then other die stacks and/or components attached to a second side of the rigid flex circuit. In this example, a jig may be used to "flip" one or more rigid flex circuits from one side to the other.

A person skilled in the relevant art will recognize that, unless the context indicates otherwise, structures disclosed herein can be formed using conventional semiconductor manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1A-6C. For example, some details of semiconductor devices and/or packages well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 1B:
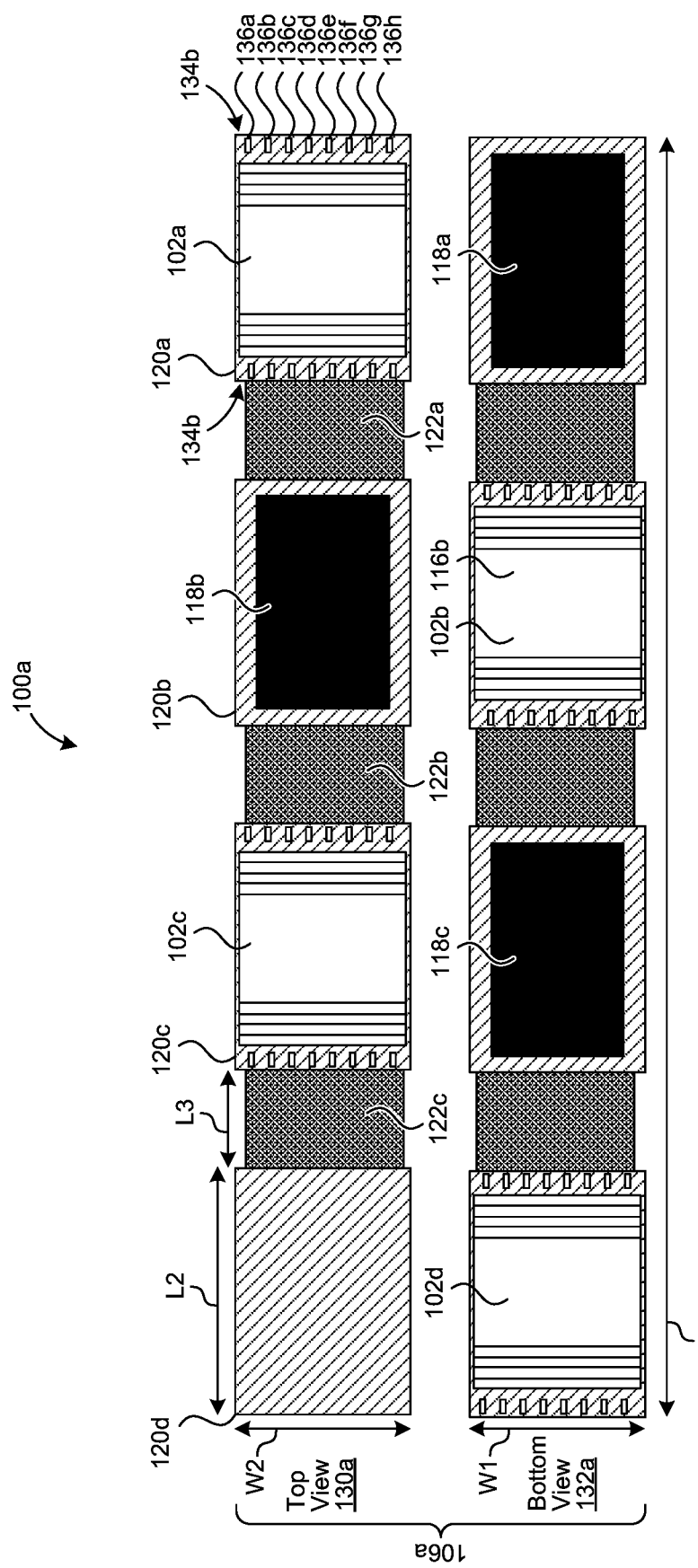
FIG. 1B illustrates top and bottom views of the rigid flex circuit with the components of FIG. 1A in accordance with embodiments of the present technology.
Figure 1C:
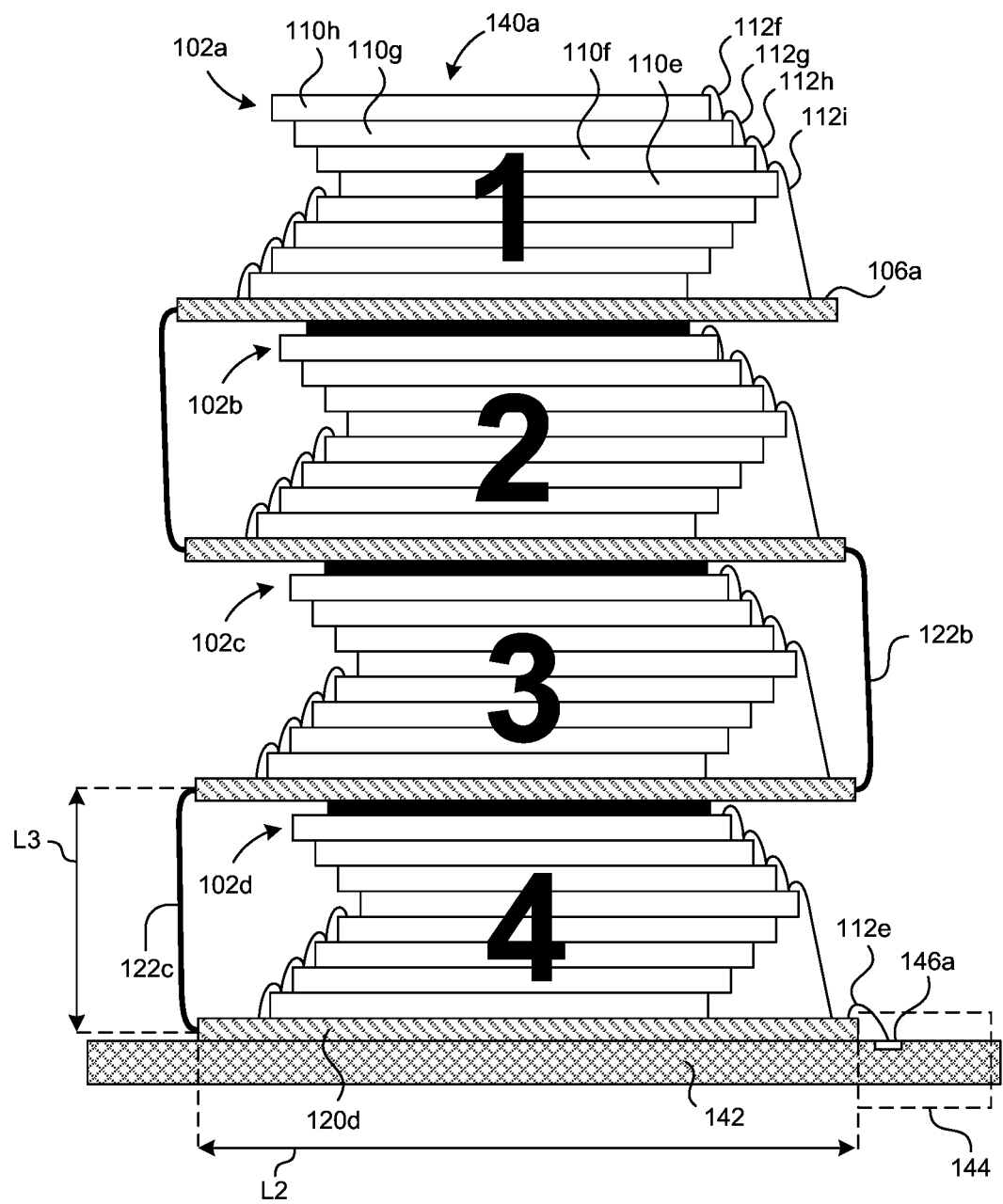
FIG. 1C is a cross-sectional view of the die stack assembly of FIG. 1A that has been bent to vertically align the die stacks in a vertically aligned assembly in accordance with embodiments of the present technology.
Figure 1D:
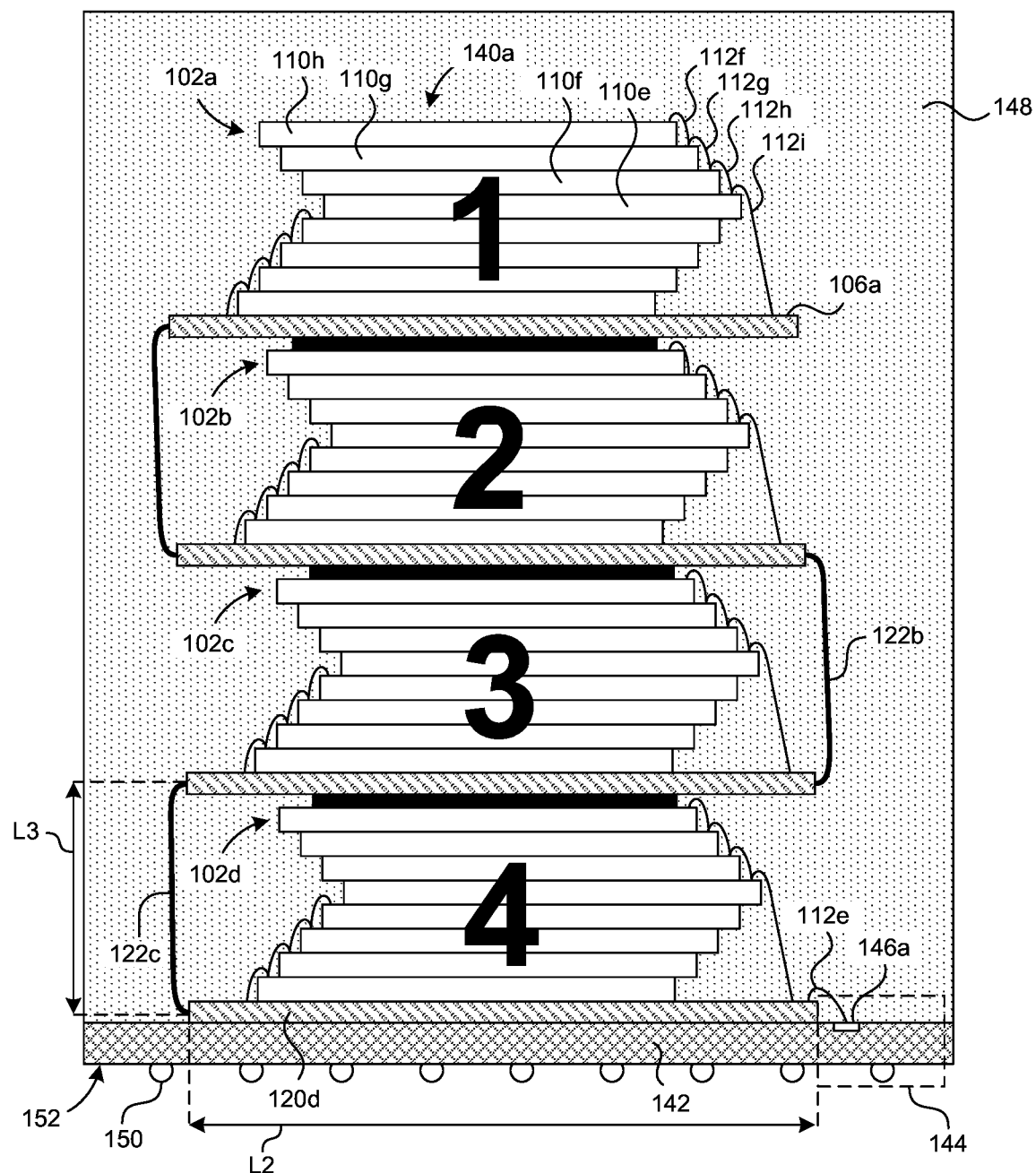
FIG. 1D shows a cross-sectional view of the die stack assembly of FIG. 1C that has been encapsulated in a molded material in accordance with embodiments of the present technology.

FIGS. 1A-1D illustrate views of semiconductor dies attached to a rigid flex circuit in accordance with embodiments of the present technology. In particular, FIG. 1A illustrates a side cross-sectional view of four die stacks attached to a rigid flex circuit (e.g., rigid flex printed circuit board) and FIG. 1B shows top and bottom views of the rigid flex circuit with components attached. FIG. 1C illustrates a side cross-sectional view of the die stacks that form a vertically aligned assembly after the rigid flex circuit has been bent in accordance with embodiments of the present technology, and FIG. 1D shows a single die attached to each rigid region of the rigid flex circuit.

Referring to FIG. 1A, rigid flex circuit 106a includes a plurality of rigid regions 120a-d alternating with one or more flexible portions 122a-c. The flexible portions 122 electrically connect adjacent rigid regions 120. Semiconductor device 100a can be bent to form a die stack assembly that includes first die stack 102a and third die stack 102c mounted or connected on a first side 104a of the rigid flex circuit 106a. Second die stack 102b and fourth die stack 102d are mounted or connected on a second side 108a of the rigid flex circuit 106a. The die stacks 102 are mounted to the rigid regions 120 of the rigid flex circuit 106a. Therefore, as shown, adjacent die stacks 102 are attached to alternating or opposite sides of the rigid flex circuit 106a. Although four die stacks 102 are shown, it should be understood that more or less die stacks 102 may be attached to the rigid flex circuit 106a, such as two die stacks 102, three die stacks 102, or more than four die stacks 102.

In some embodiments, the die stacks 102 can be formed on the rigid flex circuit 106a by attaching a first die 110 to the rigid region 120 of the rigid flex circuit 106a, a second die 110 over at least a portion of the exposed side of the first die 110, and so on. Die attach film or other known materials and methods may be used. The first die stack 102a includes individual semiconductor dies 110a-h that are vertically stacked in a shingled or stepped configuration in which each die 110 is offset horizontally from the adjacent die 110. For example, FIG. 1A depicts the die stacks 102 in a configuration that may be referred to as "reverse shingle on shingle", wherein the dies 110a-d are stepped in a first horizontal direction (e.g., first shingle) and the dies 110e-h are stepped in a second horizontal direction that is opposite to the first horizontal direction (e.g., second shingle). It should be understood that the die stacks 102 can be formed by aligning the individual dies 110 such that none or some of the dies 110 are shingled with respect to other dies 110 within the same die stack 102. The dies 110 can be memory die, such as a NAND die, an SRAM die, or other semiconductor dies. Also, although eight dies 110 are illustrated in each of the die stacks 102, more or less dies 110 can be included based on system requirements. For example, as discussed below in FIG. 1D, a single die 110 can be attached to each of the rigid regions 120. In some cases, not every rigid region may have a die 110 attached to it.

The shingled or stepped configuration allows for electrical interconnections to be accomplished between adjacent dies 110 in the die stack 102, which shortens the electrical connector lengths and minimizes the number of electrical connections made to either the rigid flex circuit 106a or a substrate (both discussed further below). Therefore, two or more dies 110 in a die stack 102 can be electrically connected to each other and then to the rigid flex circuit 106a through one or a reduced number of electrical connectors, eliminating some bond connections to the rigid flex circuit 106a (or substrate). The bond pads (shown in FIG. 2) on the rigid flex circuit 106a are connected to one or more communication layers within the rigid flex circuit 106a.

A plurality of electrical connectors 112a-d (e.g., wire bonds) couple the dies 110a-d to each other and to a bond pad (not shown for purposes of clarity) on the rigid flex circuit 106a to route signals (e.g., control signals, power signals, test signals, etc.) between these components. In some embodiments, the ends of each electrical connector 112 are attached to respective bond pads on the corresponding dies 110 (not shown for purposes of clarity). Therefore, instead of requiring separate electrical connectors 112 to electrically connect each of the dies 110a-d to the rigid flex circuit 106a, the single electrical connector 112d conveys the signals for the four dies 110a-d. The four dies 110e-h are similarly connected with electrical connectors 112f-i, and the electrical connector 112i extends from the die 110e to the rigid flex circuit 106a. The die stacks 102b-d are similarly connected.

Each of the die stacks 102 has a top side 114 (e.g., an exposed side) and a bottom side 116. A surface of the die 110 that is attached to the rigid flex circuit 106a is the bottom side 116 and a surface of the die 110 on the opposite side of the die stack 102 is the top side 114. The top sides 114a-d and the bottom sides 116a-d of the die stacks 102a-d are indicated.

Inert spacers 118a-c can be attached to the rigid flex circuit 106a to provide a mechanical and electrical separation between the rigid flex circuit 106a and a die stack 102 when the rigid flex circuit 106a is bent to position the die stacks 102 into vertical alignment. The spacer can be attached using die attach film and/or other known materials and methods. The spacers 118a and 118c are positioned on the rigid regions 120 on the second side 108a of the rigid flex circuit 106a opposite the first and third die stacks 102a and 102c, respectively. The spacer 118b is positioned on the rigid region 120 of the first side 104a of the rigid flex circuit 106a opposite the second die stack 102b. In some embodiments, the spacer 118 can be a "blank" substrate that does not include semiconductor components and is formed from, for example, substrate materials, such as silicon, glass, ceramic, and/or other suitable materials.

FIG. 1B shows a top view 130a and a bottom view 132a of the semiconductor device 100a of FIG. 1A. The top and bottom views 130a and 132a correspond to the first and second sides 104a and 108a, respectively, of the rigid flex circuit 106a. The rigid regions 120 and flexible portions 122 are indicated, as well as the die stacks 102a-d and the spacers 118a-c that are mounted or connected to the first sides 104a and second sides 108a of the rigid regions 120.

The rigid flex circuit 106a has length L1 and width W1 dimensions configured to accommodate the size and number of die stacks 102 and/or other components that are attached to the rigid regions 120, and the length(s) needed for bending the flexible portions(s) 122 when vertically aligning the die stacks 102. More die stacks 102 can be added to the same rigid flex circuit 106a by extending the alternating pattern of rigid regions 120 and flexible portions 122. For example, to maintain the same scheme for folding and attaching the vertically aligned die stacks 102 to the substrate as discussed below, an even number of die stacks 102 would be added. In other examples, a non-even number of die stacks 102 can be added.

Each of the rigid regions 120 has a length L2 and width W2 (indicated on the rigid region 120d). The length L2 and width W2 of the other rigid regions 120a-c may be the same or different than the rigid region 120d. The spacers 118a-c as shown have a smaller footprint than the width W2 and length L2 of their corresponding rigid regions 120a-c. The die stacks 102a-d also have a smaller footprint than at least the length L2 of their corresponding rigid region 120, leaving edge regions 134 (indicated on rigid region 120a as edge regions 134a and 134b). The edge regions 134 include a plurality of bond pads 136 (indicated on edge region 134a as bond pads 136a-h) for electrically connecting the electrical connectors 112 (shown in FIG. 1A) from the dies 110. Although the die stacks 102 and spacers 118 are shown as geometrically being within the length L2 and width W2 dimensions of the rigid regions 120, the components may extend beyond one or more edges of the rigid regions 120.

Each of the flexible portions 122 has a length L3 that is based on a height of the die stack 102 and/or spacer 118 and/or component that the flexible portion 122 extends alongside when the rigid flex circuit 106 is bent. Also, the length L3 of the flexible portions 122 can vary.

Returning to FIG. 1A, once the die stacks 102 and the spacers 118 are attached to the rigid flex circuit 106a and the electrical connectors 112 have been attached as needed, the rigid flex circuit 106a can be bent to bring the die stacks 102 into generally vertical alignment to form the die stack assembly. For example, the flexible portion 122c of the rigid flex circuit 106a can be bent in the direction of arrow 124c to vertically align the die stack 102d with the die stack 102c. In other words, the flexible portion 122c can be flexed through about 180 degrees to hold the rigid regions 120c-d in generally vertical alignment with each other. The top side 114d (e.g. exposed side) of the die stack 102d can be in mechanical connection with (e.g., touching and/or adhered to) the spacer 118c. The flexible portion 122b of the rigid flex circuit 106a can then be bent in the direction of arrow 124b to vertically align the die stacks 102c-d with the die stack 102b, thus aligning the rigid regions 120b-d. The top side 114c of the die stack 102c can be in mechanical connection with the spacer 118b. The flexible portion 122a of the rigid flex circuit 106a can be bent in the direction of arrow 124a to vertically align the die stacks 102b-d with the die stack 102a, thus also aligning the rigid regions 120a-d. The top side 114b of the die stack 102b can be in mechanical connection with the spacer 118a. It should be understood that the flexible portions 122a-c of the rigid flex circuit 106a can be bent in different orders to align the die stacks 102a-d.

Additionally, a space may be maintained between the top sides 114 (e.g. exposed sides) of the dies 110 or the die stacks 102 and the spacers 118 and/or rigid regions 120 when the rigid regions 120 are held generally in vertical alignment with each other. It should be understood that the embodiments discussed herein are not limited to all of the rigid regions 120 and the die stacks 102 and/or dies 110 mounted thereon being in perfect vertical alignment, and that embodiments are contemplated wherein some offset may be present between these features.

The vertically aligned die stacks 102a-d form a vertically aligned assembly 140a that can be attached to a substrate 142 as shown in FIG. 1C. The substrate 142 can be a semiconductor substrate (e.g., a silicon substrate, a gallium arsenide substrate, an organic laminate substrate, etc.) or other suitable material known in the art. In this example, the rigid region 120d, as seen in the top view 130a of FIG. 1B, is attached to the substrate 142, such as by using die attach film or other known materials and methods. As seen in this side cross-sectional view, the length L2 of the rigid regions 120 extend beyond the width of the die stacks 102, and the length L3 of the flexible portions 122 extend approximately the height of the associated die stack 102 and the spacer 118.

After the vertically aligned assembly 140a is attached to the substrate 142, electrical connection can be made between the rigid flex circuit 106a and the substrate 142. Wire bond keep-out area 144 is shown on the substrate 142 proximate the vertically aligned assembly 140a. Electrical connector 112e extends to a wire bond connection point 146a, such as a ball grid array (BGA). After the electrical connections have been made between the vertically aligned assembly 140a and the substrate 142, an encapsulant or molding material 148 can then be formed around the die stacks 102 and electrical connectors 112 of the vertically aligned assembly 140a as shown in FIG. 1D to provide structural integrity and environmental sealing therefor. A plurality of solder balls 150 can be formed on an opposite side 152 of the substrate 142. The solder balls 150 can connect to a variety of conductive features (not shown) formed within the substrate 142, such as internal contacts, vias, and traces. One or more of these conductive features can provide electrical connections (e.g., power, ground, and signals) to the wire-bond connection point 146a, for example.

Although in the foregoing example embodiments, semiconductor device assemblies have been illustrated and described as including die stacks 102 disposed over four rigid regions 120 of a rigid flex circuit 106, in other embodiments of the present technology different numbers of dies (e.g., 1, 2, 3, 5, 6, 7, 8, etc.) can be provided on each of any number of rigid regions 120 (e.g., 2, 3, 5, 6, 7, 8, etc.) of a rigid flex circuit 106.

Technical advantages, such as smaller wire bond keep-out areas 144 and shorter electrical connectors 112 are realized when using the rigid flex circuit 106a to form stacked die structures such as the vertically aligned assembly 140a. Referring to the die stack 102a in FIG. 1C, the electrical connectors 112f-h connect the dies 110e-h, and the electrical connector 112i provides the electrical connection for all of the dies 110e-h to the rigid flex circuit 106a. If the vertically aligned assembly 104a, including the 32 dies 110, did not include the rigid flex circuit 106a, the electrical connector 112i would instead extend from the die 110e to the substrate 142. This results in long electrical connectors 112 that are difficult to attach to the substrate 142, and each electrical connector 112 needs space to be attached without interference from another electrical connector 112. Using the rigid flex circuit 106a minimizes the amount of space needed to bond electrical connectors 112, and available space on the substrate 142 is increased to allow additional passive and/or active components to be mounted. In other words, the footprint required on the substrate 142 is reduced while capacity is increased when the rigid flex circuit 106a is used to form the vertically aligned assembly 140a.

For example, a stacked die structure using 16 dies 110 without the rigid flex circuit 106a may have a wire bond keep-out area 144 of approximately 600 microns (e.g. micrometer) and have electrical connectors 112 that extend approximately 1.5 millimeters (mm). A stacked die structure using 32 dies 110 without the rigid flex circuit 106a may have a wire bond keep-out area 144 of approximately 1200 microns and have electrical connectors 112 that extend approximately 3 mm. In some embodiments, the wire bond keep-out area 144 in FIG. 1C, for the vertically aligned assembly 140a that has 32 dies 110, can be approximately 600 microns, or about the same size as a stacked die structure using 16 dies 110. In addition, the length of the electrical connector 112 can be reduced to approximately 1 mm. It should be understood that these measurements are examples only, and many factors, such as thickness and number of dies 110, can change the length of electrical connectors 112.

Figure 2:
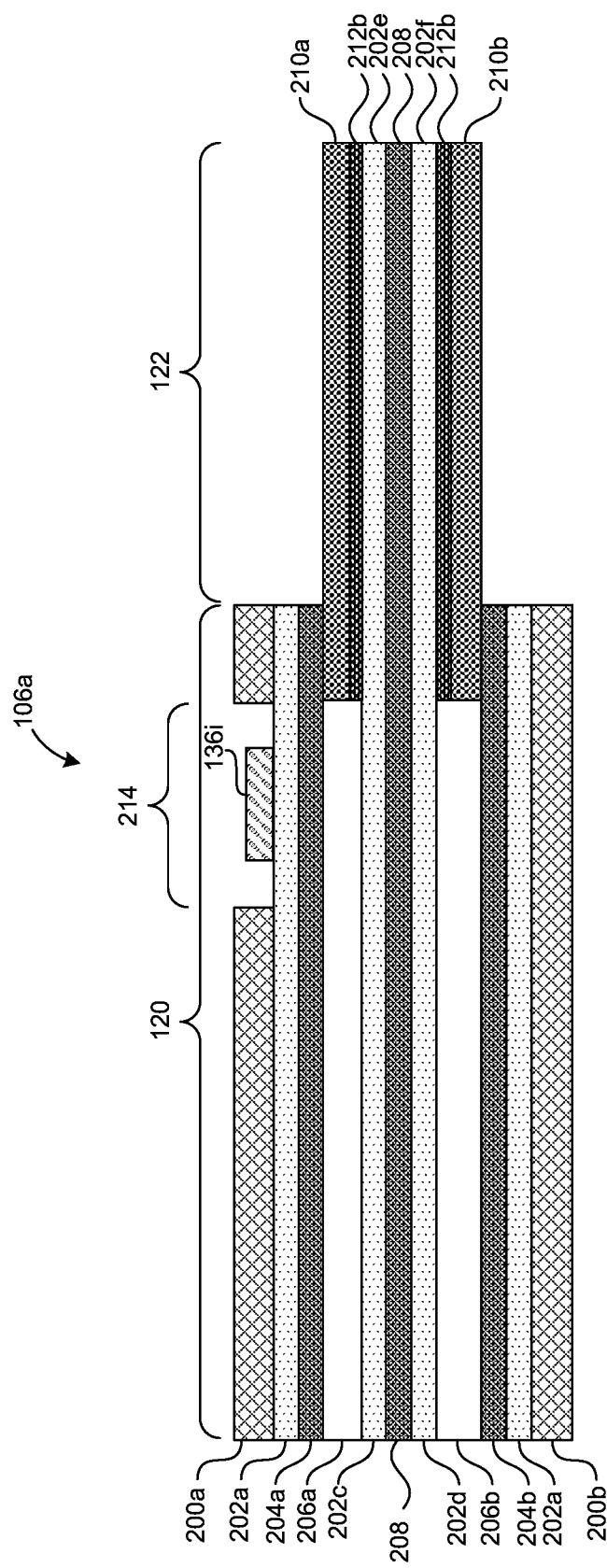
FIG. 2 is a cross-sectional view of a rigid flex circuit in accordance with embodiments of the present technology.

FIG. 2 illustrates a side cross-sectional view of the rigid flex circuit 106a that includes a plurality of layers in accordance with embodiments of the present technology. One rigid region 120 and one flexible portion 122 are shown. The rigid flex circuit 106a is a stack and/or laminate of layers. The rigid and flexible portions 120, 122 can include different layers depending upon the functionality needed.

The rigid flex circuit 106a shown in FIG. 2 is exemplary only. The number and configuration of layers can be determined based on the application. The size or number of layers can be increased to increase signal capacity. The layers of the rigid flex circuit 106a and the communication capacity can be custom designed for the application, such that different rigid flex circuits 106 can be used for different applications.

As shown, the rigid flex circuit 106a includes soldermask layers 200a-b, copper layers 202a-d, FR4 layers 204a-b, prepreg layers 206a-b, and polyimide core layer 208. The soldermask layers 200a-b can provide rigidity to the rigid region 120. Additional and/or different layers can extend out of the rigid region 120 to form the flexible portion 122. For example, polymide coverlay 210a-b, coverlay adhesive 212a-b, copper layer 202e-f, and the polyimide core layer 208. The polyimide core layer 208 can provide structure while allowing the flexible portion 122 to flex.

In some embodiments, an opening 214 within an outer layer such as the soldermask 200a can expose a bond pad 136i or other connection point for connecting a wire bond to the rigid flex circuit 106a. The bond pad 136i can connect, for example, to one or more of the copper layers 202e-f through via(s) (not shown). A via can extend from an outer layer to an inner layer, and can permit communication between two or more layers. The copper layers 202e-f, or other appropriate layers, can be referred to as interconnect layers. In some cases, the copper layers 202e-f can be patterned with traces of copper (or other conductive material) that are separates from each other to keep signals separate where appropriate. In other cases, some or all of a copper layer 202e-f can form a ground plane. The copper layers 202e-f (e.g., interconnect layers) can convey signals between the die stacks 102 and/or other components mounted to the rigid flex circuit 106, and/or a collection area (not shown) of the rigid flex circuit 106a. One or more electrical connectors can be connected to the collection area to convey the signals to and/or from the substrate 142. This provides the advantage of a reduced area size of the substrate 142 that is needed to provide interconnection with the die stacks 102.

Figure 3:
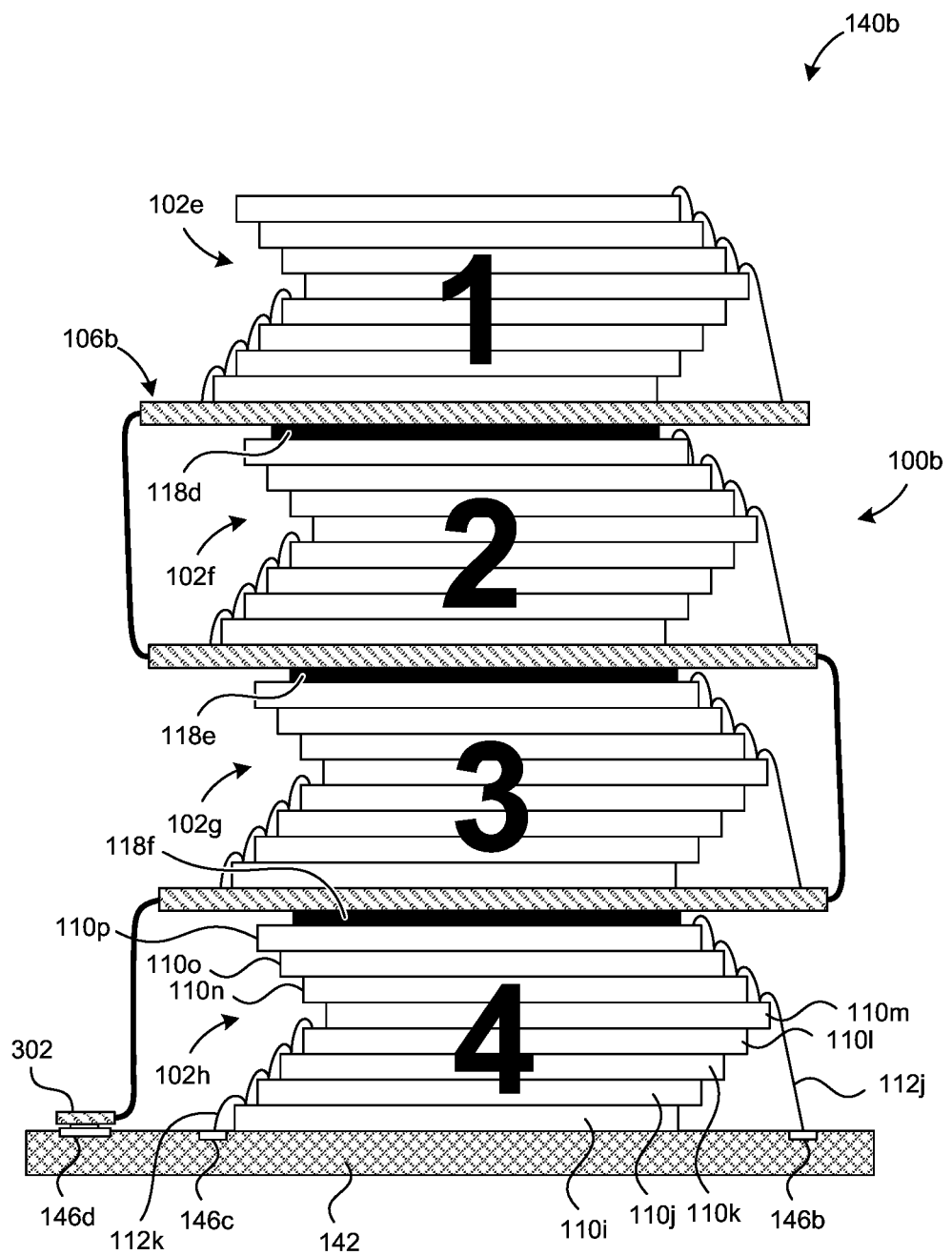
FIG. 3 is another cross-sectional view of a vertically aligned assembly including a plurality of die stacks and a rigid flex circuit in accordance with embodiments of the present technology.

FIG. 3 illustrates another vertically aligned assembly 140b formed in accordance with embodiments of the present technology. The die stacks 102e-g and the spacers 118d-f are attached to the rigid flex circuit 106b as discussed with respect to FIG. 1A to form the semiconductor device 100b. Therefore, the rigid flex circuit 106b conveys the signals between the die stacks 102e-g and the substrate 142. In comparison with FIG. 1C, the rigid flex circuit 106b is not between fourth die stack 102h and the substrate 142, thus lowering the overall height of the vertically aligned assembly 140b. This can provide the advantage of allowing one or more additional dies 110 to be added to the vertically aligned assembly 140b, increasing overall capacity of the semiconductor package.

The die stack 102h can be attached to the substrate 142, such as with die attach film. In some embodiments, the die 110*i* can be attached to the substrate 142 and subsequent dies 110 attached to form the reverse shingle on shingle configuration of the die stack 102*h*. In other embodiments, the die stack 102*h* can be formed separately and then attached to the substrate 142. Once the die stack 102*h* is attached to the substrate 142, the electrical connectors 112 can be connected between the dies 110*i-l* and between the dies 110*m-p*. The electrical connector 112*j* is connected to the substrate 142 at wire bond connection point 146*b* and conveys signals between the four dies 110*m-p*, which are connected together, and the substrate 142. The electrical connector 112*k* is connected to the substrate 142 at wire bond connection point 146*c* and conveys signals between the four dies 110*i-l*, which are connected together, and the substrate 142.

The rigid flex circuit 106*b* can be positioned over the die stack 102*h* so that the spacer 118*f* is in communication with the top side of the die stack 102*h*. In some cases, the spacer 118*f* may be adhered to the die stack 102*h*. The rigid flex circuit 106*b* can have a connection pad 302 that connects one or more electrical connectors of the rigid flex circuit 106*b* with the substrate 142 at wire bond connection point 146*d*. In some cases, a reflow operation can be used to reflow the solder, which may be present on one or both of the connection pad 302 and wire bond connection point 146*d*, to attach the rigid flex circuit 106*b* to the substrate 142.

In other embodiments, one or more different components (e.g., active and/or passive components, shorter or taller die stack, etc.) may be attached to the substrate 142 instead of the die stack 102*h*. The die stack assembly can then be positioned over the one or more different components.

In both of the embodiments shown in FIGS. 1C and 3, a technical advantage is realized as less space on the substrate 142 is needed to interconnect the die stacks 102 with the substrate 142, saving room for additional components. Also, fewer electrical connectors 112 are needed, which increases the ease of attaching the electrical connectors 112 to the substrate 142 and decreases the problem of electrical connectors 112 interfering with each other.

In some cases, it can be desirable to lower the height of one or more die stacks 102 because A) the die stack 102 is too high for the package, B) to more evenly balance the height of adjacent die stacks 102, C) to minimize signal communication in the substrate 142, and/or D) to incorporate additional components. FIG. 4A shows one die stack 102*i* and a controller die 400*a* attached or connected to rigid regions 120*e* and 120*f*, respectively, of the rigid flex circuit 106*c* in accordance with embodiments of the present technology. The controller die 400*a* (e.g., a microcontroller) can be configured to control the operations of at least the dies 110 of the die stack 102*i* through the rigid flex circuit 106*c*.

The rigid flex circuit 106*c* can include rigid regions 120*e-g* that alternate with flexible portions 122*d-e*. The rigid region 120*f* can be generally or approximately the same length as the rigid regions 120*e* and 120*g*.

The die stack 102*i* can be mounted on the rigid region 120*e* as previously discussed, and electrical connectors 112 attached so that the dies 110 are connected to each other. Electrical connector 112*l* and/or other connectors conveys the signals to/from one of the dies 110 and the rigid flex circuit 106*c* at wire bond 146*e*.

The controller die 400*a* can be mounted to the rigid region 120*g* of the rigid flex circuit 106*c* proximate wire bond connection point 146*f*, which can be in communication with one or more interconnect layers within the rigid flex circuit 106*c* that convey signals. Molding material 404*a* can then be applied to encase the controller die 400*a*. Alternatively, the controller die 400*a* can be pre-molded with the molding material 404*a* before being attached to the rigid flex circuit 106*c*. One or more electrical connector can, in some cases, connect the controller die 400*a* to the wire bond connection point 146*f*. In other cases, the controller die 400*a* can interconnect with one or more interior signal conveying layers (e.g., interconnect layer(s)) in the stack of layers within the rigid flex circuit 106*c*, such as through vias (not shown). Accordingly, in some embodiments, the communication between the dies 110 of the die stack 102*i* and the controller die 400*a* can be accomplished through one or more layers of the rigid flex circuit 106*c*. This provides the advantage of freeing space within the substrate 142 that may previously have been used for signal routing between the die stack 102*i* and the controller die 400*a*.

FIG. 4B shows the rigid flex circuit 106*c* bent to position the die stack 102*i* over the controller die 400*a* to form a generally vertically aligned assembly 140*c* in accordance with embodiments of the present technology. The rigid flex circuit 106*c* can be bent at flexible portion 122*e* to extend substantially vertically proximate the molding material 404*a*. The flexible portion 122*e* can have a length to accommodate the height of the molding material 404*a*. The rigid flex circuit 106*c* is bent to extend the rigid region 120*f* along a top surface of the molding material 404*a*. The rigid flex circuit 106*c* is again bent at flexible portion 122*d* to position the rigid region 120*e* over the rigid region 120*f*.

Figure 4C:
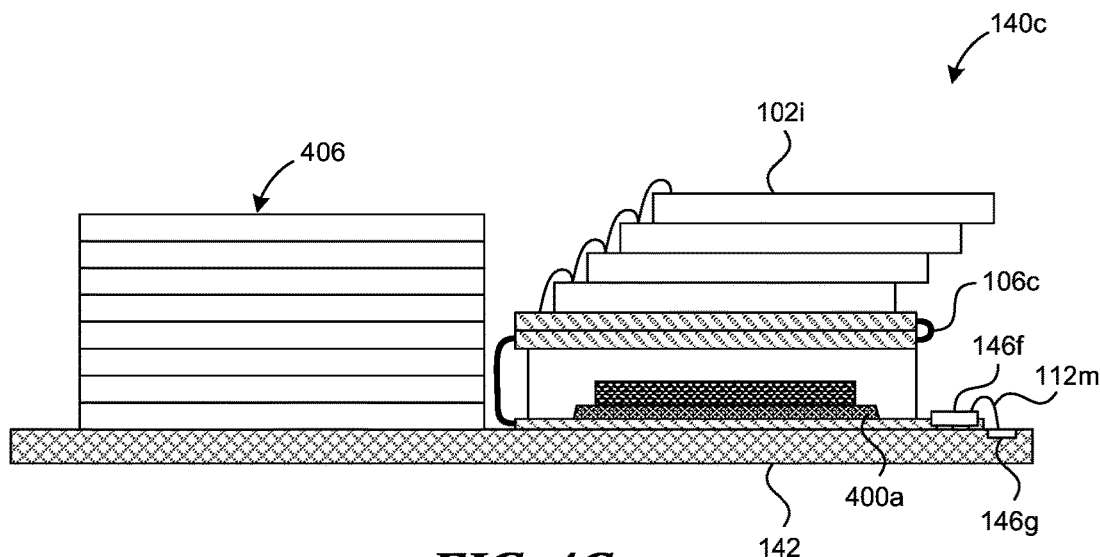
FIG. 4C is a cross-sectional view of the vertically aligned assembly of FIG. 4B that has been mounted to a substrate in accordance with embodiments of the present technology.

FIG. 4C shows the vertically aligned assembly 140*c* of FIG. 4B mounted to a substrate 142 with a stack 406 of other components in accordance with embodiments of the present technology. In some embodiments, the stack 406 may include a plurality of DRAM dies, while the die stack 102*i* includes NAND dies. The rigid flex circuit 106*c* conveys signals associated with the die stack 102*i* and the controller die 400*a* to/from the wire bond connection point 146*f*. Electrical connector 112*m* connects the wire bond connection point 146*f* on the rigid flex circuit 106*c* with wire bond connection point 146*g* on the substrate 142.

Figure 4D:
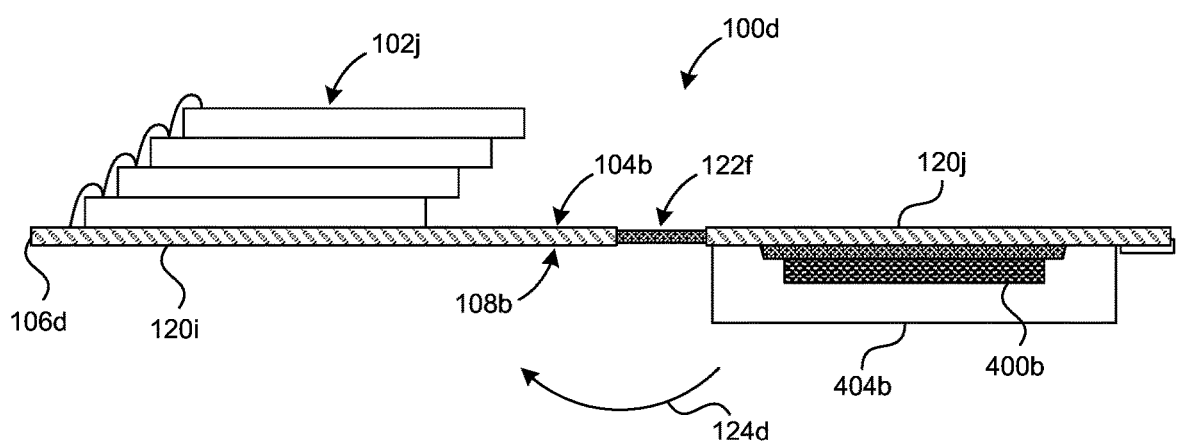
FIG. 4D is a cross-sectional view of similar components as were used in FIG. 4A that are mounted on opposing sides of a rigid flex circuit in accordance with embodiments of the present technology.

FIG. 4D illustrates a semiconductor device 100*d* wherein the controller die 400*b* is mounted on the opposite side of rigid flex circuit 106*d* than die stack 102*j* in accordance with embodiments of the present technology. For example, the die stack 102*j* is mounted to the first side 104*b* of the rigid flex circuit 106*d* and the controller die 400*b* is mounted to the second side 108*b* of the rigid flex circuit 106*d*. In this embodiment, the rigid flex circuit 106*b* can be shorter (compared to the rigid flex circuit 106*c* of FIG. 4A) and configured with fewer alternating rigid regions 120 and flexible portions 122. For example, the rigid flex circuit 106*d* can include two rigid regions 120*i-j* with one flexible portion 122*f* therebetween. The rigid flex circuit 106*d* can be bent in the direction of arrow 124*d* to vertically align the rigid regions 120*i-j* with each other, forming a vertically aligned assembly 140 similar to the vertically aligned assembly 140*c* of FIG. 4C. The vertically aligned assembly 140 can be mounted on the substrate 142 as discussed in FIGS. 1C and 4C.

Figure 5A:
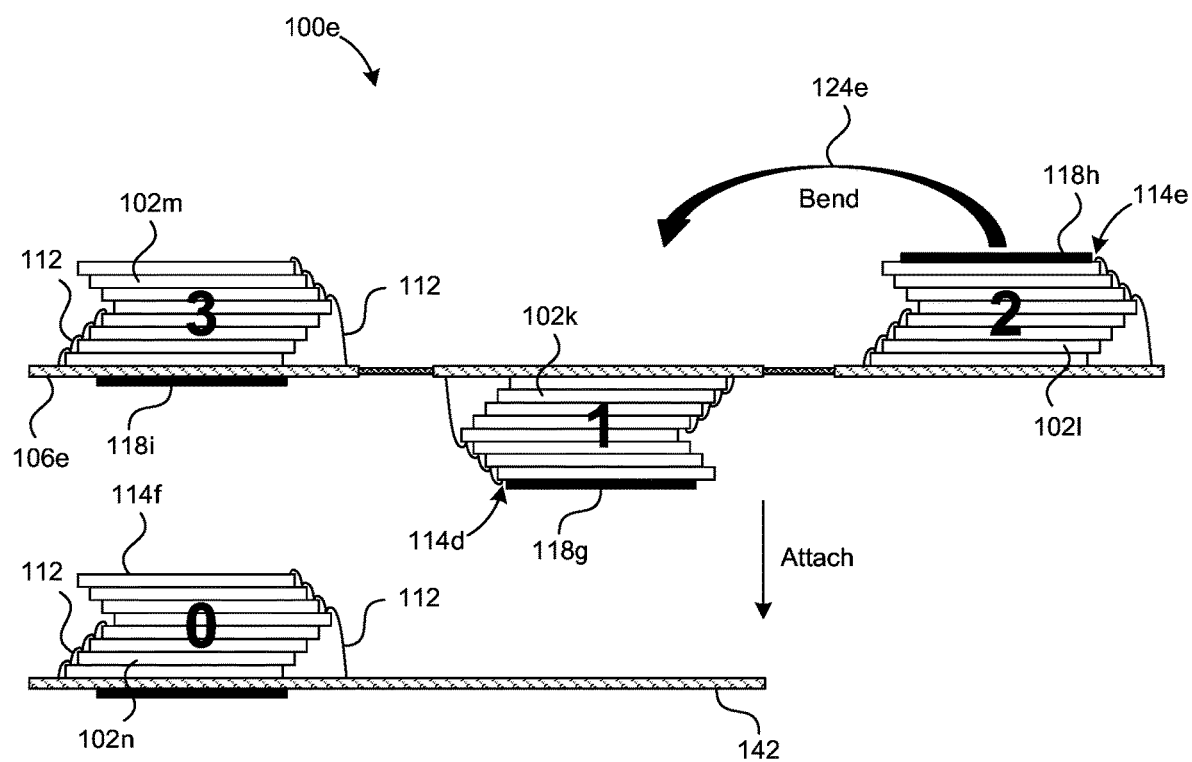
FIG. 5A is a cross-sectional view illustrating the use of a rigid flex circuit in side-by-side or adjacent die stack structures in accordance with embodiments of the present technology.

FIG. 5A illustrates a semiconductor device 100*e* that has three die stacks 102*k-m* mounted on alternating sides of the rigid flex circuit 106*e* in accordance with embodiments of the present technology. The three die stacks 102*k-m* are mounted on rigid regions 120 that alternate with two flexible portions as previously discussed. Spacers 118*g-h* are attached to top sides 114*d-e* of the die stacks 102*k-l*, respectively. Spacer 118*i* is attached on the opposite side of the rigid flex circuit 106*e* as the die stack 102*m*. The electrical connectors 112 can be attached between the dies 110, die stacks 102*k-m*, and the rigid flex circuit 106*e* as previously discussed in FIG. 1A.

The rigid flex circuit 106*e* can be bent in the direction of arrow 124*e* to vertically align the die stacks 102*k-l*. When bent, the spacer 118*h* can be in mechanical connection with the rigid flex circuit 106*e*.

Figure 5B:
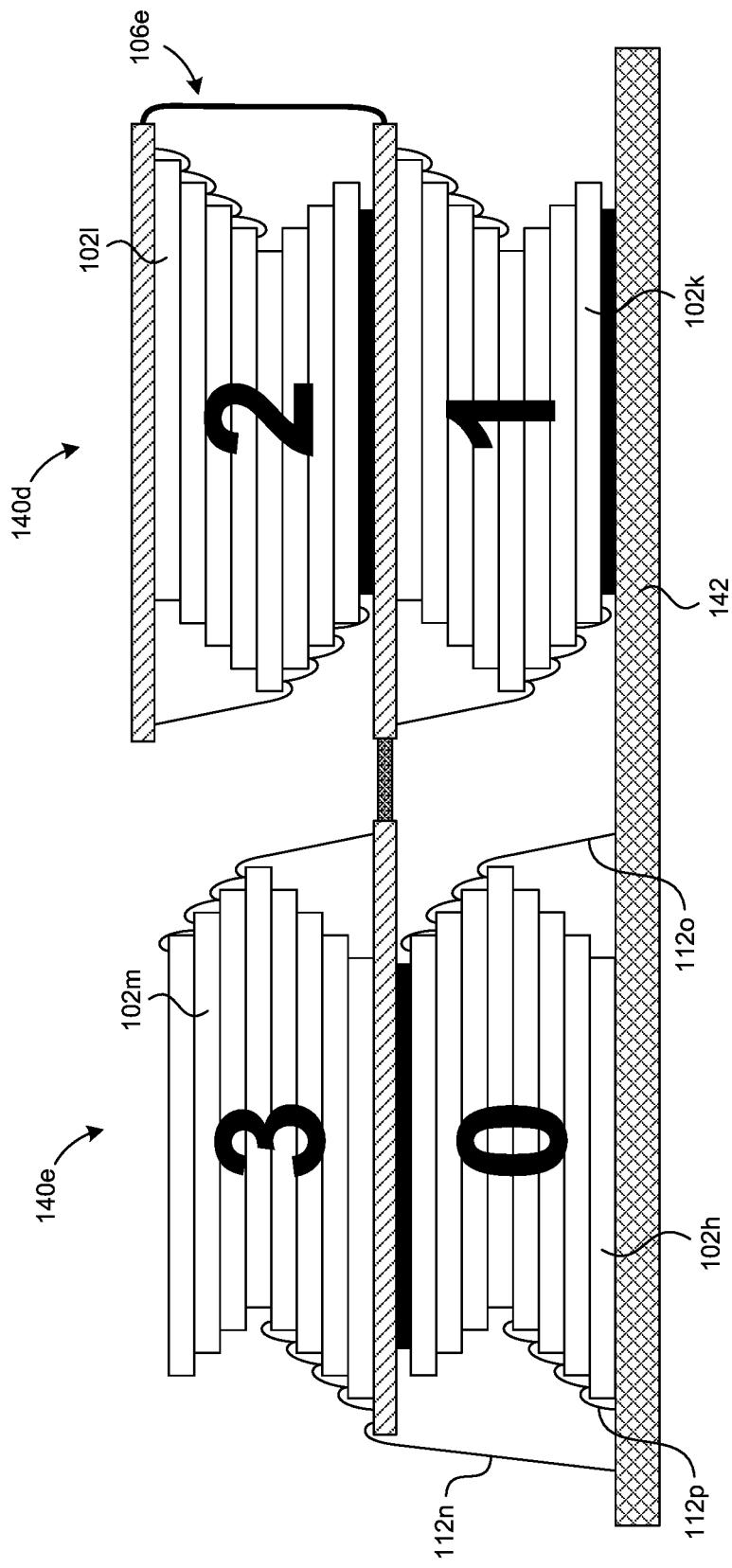
FIG. 5B is a cross-sectional view of the die stack assembly of FIG. 5A that has been bent and attached to the substrate and another die stack in accordance with embodiments of the present technology.

Die stack 102*n* can be mounted on substrate 142 and the electrical connectors 112 can be attached between the dies 110, die stack 102*n*, and the substrate 142 as discussed in FIG. 3. The semiconductor device 100*e* can be attached or mounted on the substrate 142 as previously discussed, positioning the spacer 118*i* in mechanical connection with top side 114*f* of the die stack 102*n* as shown in FIG. 5B. When bent, the rigid flex circuit 106*e* forms vertically aligned assembly 140*d* and combines with the die stack 102*n* to form vertically aligned assembly 140*e*. The rigid flex circuit 106*e* can be electrically connected to the substrate 142 through electrical connector 112*n*.

A technical advantage of side-by-side embodiments is that the die stacks 102, controller die (not shown) and/or other components, can be mounted to the rigid flex circuit 106, and then attached to a die stack 102 (such as the die stack 102*n*) or other component that does not communicate through the rigid flex circuit 106*e*, as shown in FIG. 5B. The signals to/from the die stacks 102*k-m* are conveyed through the rigid flex circuit 106*e* and through electrical connector 112*n* to the substrate 142, providing the benefit of reducing the routing space previously needed on the substrate 142 for the signals associated with the die stacks 102*k-m*. Signals to/from the die stack 102*n* are conveyed through electrical connectors 112*o-p* to the substrate 142, wherein each of the electrical connectors 112*o* and 112*p* conveys information for a plurality of die 110 in the die stack 102*n*. As with other embodiments herein, it should be understood that other numbers of die 110 can be used to form a die stack 102, and different numbers of die stacks 102 can be vertically aligned and/or positioned in close proximity to each other. Also, the rigid flex circuit 106 can be configured to mechanically interface with different numbers of die stacks 102 and/or other components mounted to the substrate 142, such as two side-by-side die stacks 102 or a die stack 102 positioned proximate a controller die 400.

Figure 5C:
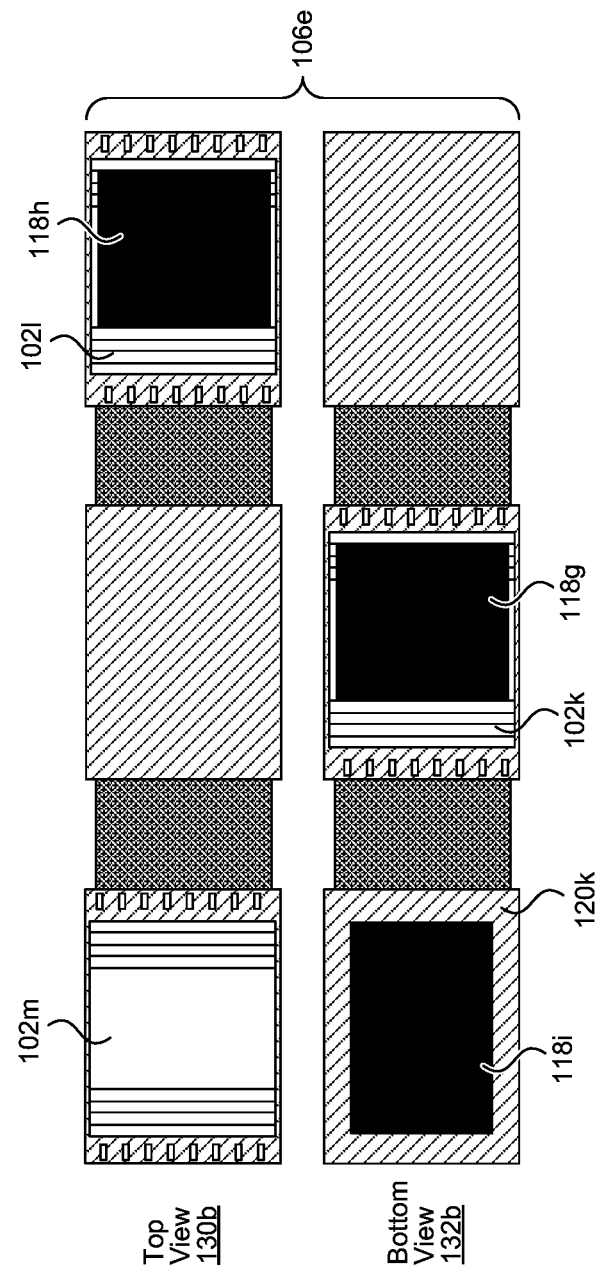
FIG. 5C illustrates top and bottom views of the rigid flex circuit with the components of FIG. 5A in accordance with embodiments of the present technology.

FIG. 5C shows top and bottom views 130*b*, 132*b* of the rigid flex circuit 106*e* with the die stacks 102*k-m* and spacers 118*g-i* attached. The die stacks 102*k-m* can be mounted to the rigid flex circuit 106*e* as previously discussed. As shown, the spacers 118*g-i* are attached either to the surface of rigid region 120*k* of the rigid flex circuit 106*e* or the top side 114*d-e* of the die stacks 102*k-l* as shown in FIG. 5A. It should be understood that spacers 118 can be mounted to any of the surfaces, including the substrate 142, to provide the mechanical separation of applicable components.

Figure 6A:
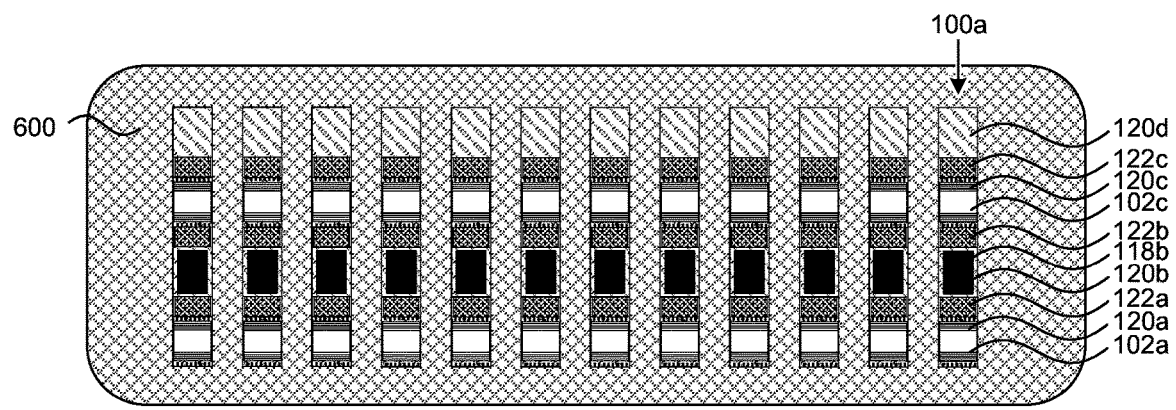
FIGS. 6A-6C show a top-down view of a process for fabricating multiple die stack assemblies in accordance with embodiments of the present technology.
Figure 6B:
Figure 6C:
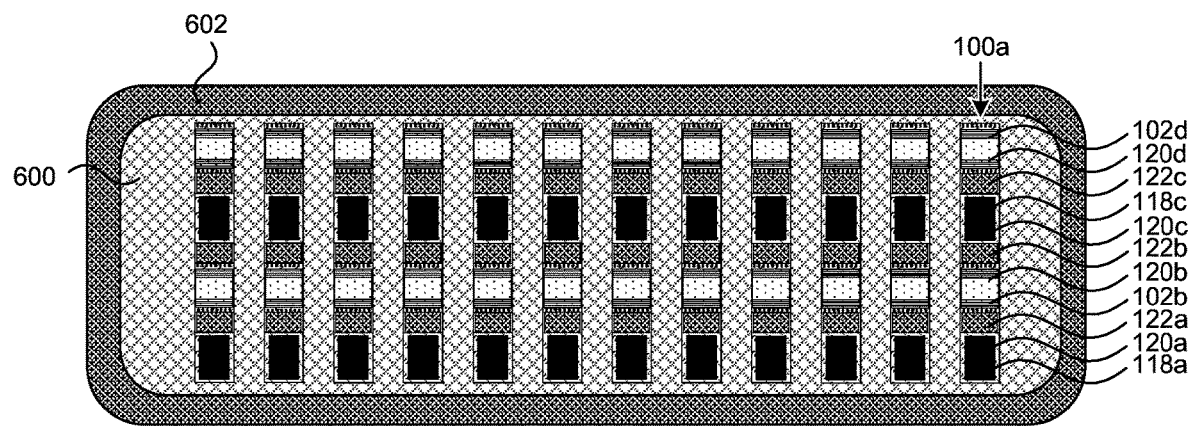

FIGS. 6A-C illustrate using a jig to assemble the semiconductor devices 100 in accordance with embodiments of the present technology. In some embodiments, strips of the laminated material can be formed individually before the components are attached to the rigid flex circuits 106. A plurality of the individual strips of laminated material can be held in place by a piece of material.

FIG. 6A shows a plurality of semiconductor devices 100 that can be held in place by a supportive material 600. Individual dies 110, die stacks 102, spacers 118, and/or other components such as controller dies 400 can be attached to the rigid flex circuits 106. In some cases, the die stacks 102 are formed on the rigid flex circuits 106, while in others, the die stacks 102 have been pre-formed separately and are then attached.

The die stack assemblies shown in FIG. 6A correspond to the first side 104*a* of the semiconductor devices 100*a* of FIG. 1A. The die stacks 102*a* and 102*c* are mounted on the rigid regions 120*a* and 120*c*, respectively, and the spacer 118*b* is mounted on the rigid region 120*b*. The flexible portions 122*a-c* alternate with the rigid regions 120*a-d*. In some cases, the dies 110 on the bottom half of the die stacks 102*a* and 102*c* can be mounted, such as with a die attach tool. A wire bond tool can then attach the electrical connectors 112 to the mounted dies 110. This process can be repeated to mount the top half of the die stacks 102*a* and 102*c* and attach the electrical connectors 112. In other embodiments, the electrical connectors can be attached after all of the components are attached to a first side of the rigid flex circuit 106. Therefore, the die stacks 102*a* and 102*c* can undergo parallel die attach and wire bonding steps, providing an advantage of minimizing the number of iterations required for assembling the die stacks 102 on the rigid flex circuit 106.

After the components and desired mechanical and electrical connections are complete, a jig 602, as shown in FIG. 6B, can be applied to the material 600. FIG. 6C shows the assembly of FIG. 6A that has been rotated or flipped such that the components (e.g., the die stacks 102*b* and 102*d* and the spacers 118*a* and 118*c*) can be mounted as discussed above to the second side 108 of the semiconductor devices 100*a*, along with the interconnecting electrical connectors 112. Once all of the components are in place and electrical/mechanical connections are complete, the semiconductor devices 100 can be separated or singulated from the material 600. It should be understood that other assembly processes are contemplated, including assembling the semiconductor devices 100 individually, by hand, by a machine, in large separable sheets, etc., and that the embodiments are not limited to the assembly/fabrication process shown in FIGS. 6A-6C.

Figure 7:
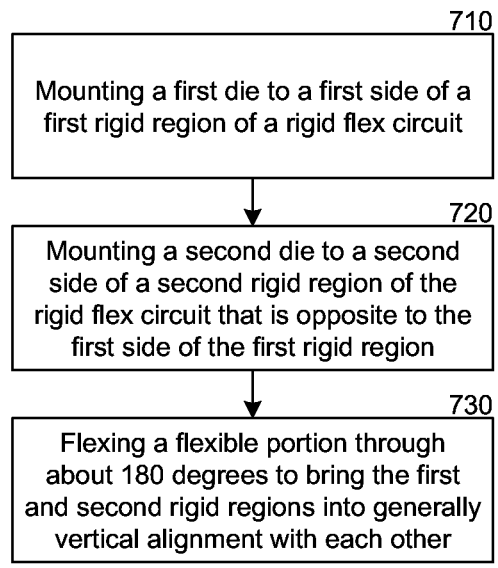
FIG. 7 is a flow chart illustrating a method of making a semiconductor device assembly in accordance with an embodiment of the present technology.

FIG. 7 is a flow chart illustrating a method of making a semiconductor device. The method includes mounting a first die to a first side of a first rigid region of a rigid flex circuit (box 710). The method further includes mounting a second die to a second side of a second rigid region of the rigid flex circuit that is opposite to the first side of the first rigid region (box 720). A flexible portion of the rigid flex circuit is flexed through about 180 degrees to bring the first and second rigid regions into generally vertical alignment with each other (box 730).

Figure 8:
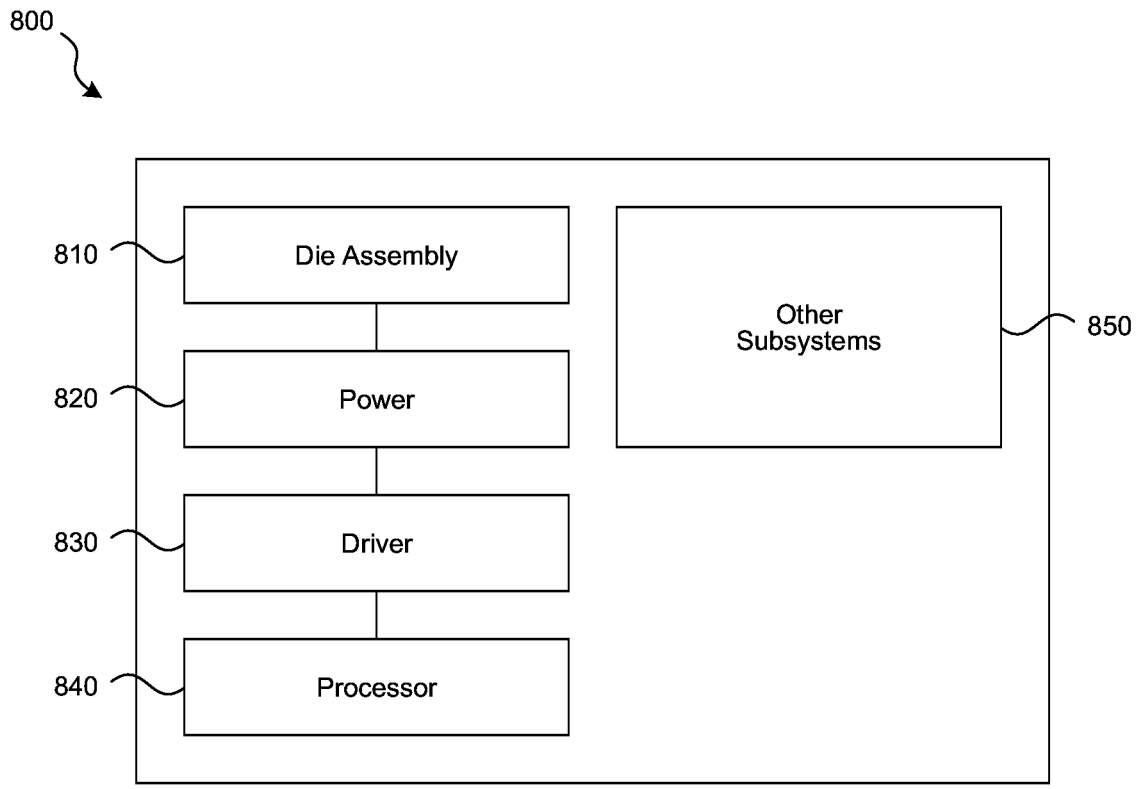
FIG. 8 is a schematic view showing a system that includes a semiconductor device assembly configured in accordance with an embodiment of the present technology.

Any one of the semiconductor devices, assemblies, and/or packages described above with reference to FIGS. 1A through 7 can be incorporated into any of a myriad of larger and/or more complex systems, a representative example of which is system 800 shown schematically in FIG. 8. The system 800 can include a semiconductor device assembly 810, a power source 820, a driver 830, a processor 840, and/or other subsystems or components 850. The semiconductor device assembly 810 can include features generally similar to those of the semiconductor device assemblies described above. The resulting system 800 can perform any of a wide variety of functions such as memory storage, data processing, and/or other suitable functions. Accordingly, representative systems 800 can include, without limitation, hand-held devices (e.g., mobile phones, tablets, digital readers, and digital audio players), computers, vehicle and other machines and appliances. Components of the system 800 may be housed in a single unit or distributed over multiple, interconnected units (e.g., through a communications network). The components of the system 800 can also include remote devices and any of a wide variety of computer readable media.

From the foregoing, it will be appreciated that specific embodiments of the technology have been described herein for purposes of illustration, but that various modifications may be made without deviating from the disclosure. Accordingly, the technology is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor device, comprising:
   a rigid flex circuit having a first rigid region and a second rigid region electrically connected by a flexible portion, wherein the first rigid region, the second rigid region, and the flexible portion share a common continuous core layer and one or more common continuous conductive layers, and wherein each of the first and second rigid regions include, on opposing sides thereof, a solder mask material that is excluded from the flexible portion;
   a first die mounted to a first side of the first rigid region; and
   a second die mounted to a second side of the second rigid region, the first and second sides being on opposite sides of the rigid flex circuit, wherein the flexible portion is bent to hold the first and second rigid regions in generally vertical alignment with each other.

2. The semiconductor device of claim 1, wherein the first rigid region further comprises at least one bond pad on the first side.

3. The semiconductor device of claim 1, further comprising a first electrical connector electrically coupling the first die and the rigid flex circuit within the first rigid region.

4. The semiconductor device of claim 1, further comprising:
   a package substrate coupled to a first side of the second rigid region; and
   a second electrical connector electrically coupling the package substrate and the rigid flex circuit within the second rigid region.

5. The semiconductor device of claim 1, further comprising a third die mounted over at least a portion of an exposed side of the first die.

6. The semiconductor device of claim 5, further comprising at least one electrical connector connecting the first die and the third die.

7. A semiconductor device, comprising:
   a rigid flex circuit having a first rigid region and a second rigid region electrically connected by a flexible portion, wherein the first rigid region, the second rigid region, and the flexible portion share a common continuous core layer and one or more common continuous conductive layers, and wherein each of the first and second rigid regions include, on opposing sides thereof, a solder mask material that is excluded from the flexible portion, wherein each of the first and second rigid regions having at least one bond pad thereon, and wherein the flexible portion is configured to be flexed through about 180 degrees to hold the first and second rigid regions in generally vertical alignment with each other;
   a first die mounted to a first side of the first rigid region, the first die electrically connected to the at least one bond pad on the first rigid region;
   a second die mounted to a second side of the second rigid region, the second die electrically connected to the at least one bond pad on the second rigid region, wherein the first side of the first rigid region and the second side of the second rigid region are on opposite sides of the rigid flex circuit;
   a package substrate connected to the rigid flex circuit when the rigid flex circuit is bent to bring the first die and the second die into generally vertical alignment; and
   an electrical connector connecting the rigid flex circuit and the substrate.

8. The semiconductor device of claim 7, wherein the rigid flex circuit further comprises a third rigid region and a second flexible portion electrically connecting the third rigid region to the second rigid region, wherein the second flexible portion is flexed through about 180 degrees to hold the first, second, and third rigid regions generally in vertical alignment with each other.

9. The semiconductor device of claim 7, wherein the rigid flex circuit includes an interconnect layer extending along at least a portion of a length of the rigid flex circuit, at least a portion of the interconnect layer electrically connected to at least one of the bond pads.

10. The semiconductor device of claim 9, further comprising:
    a third die stack mounted to a third rigid region of the rigid flex circuit; and
    at least one second electrical connector coupling at least one die in the third die stack and the rigid flex circuit.

11. The semiconductor device of claim 7, further comprising at least a third die mounted over at least a portion of the first die to form a die stack.

12. The semiconductor device of claim 7, further comprising a spacer separating an exposed side of the second die and a second side of the first rigid region when the rigid flex circuit is bent to hold the first and second rigid regions generally in vertical alignment with each other.

13. The semiconductor device of claim 12, wherein the spacer is mounted to the exposed side of the second die or to the rigid flex circuit.

14. The semiconductor device of claim 7, further comprising:
    a third die stack mounted to the substrate, the third die stack comprising at least one die; and
    at least one second electrical connector coupling at least some of the dies in the third die stack and the substrate, the third die stack positioned between the substrate and at least a portion of the rigid flex circuit.

15. The semiconductor device of claim 7, further comprising:
    a first plurality of dies mounted over the first die to form a first die stack, the first die and the first plurality of dies being electrically connected to each other; and
    a second plurality of dies mounted over the second die to form a second die stack, the second die and the second plurality of dies being electrically connected to each other.

16. The semiconductor device of claim 7, wherein the first and second dies are each one of a semiconductor die, a controller die, a molded controller die, or a memory die.

17. A method for forming a semiconductor device, comprising:
- providing a rigid flex circuit having a first rigid region and a second rigid region electrically connected by a flexible portion, wherein the first rigid region, the second rigid region, and the flexible portion share a common continuous core layer and one or more common continuous conductive layers, and wherein each of the first and second rigid regions include, on opposing sides thereof, a solder mask material that is excluded from the flexible portion;
- mounting a first die to a first side of the first rigid region of the rigid flex circuit;
- mounting a second die to a second side of the second rigid region of the rigid flex circuit that is opposite to the first side of the first rigid region; and
- flexing the flexible portion through about 180 degrees to bring the first and second rigid regions into generally vertical alignment with each other, the flexible portion extending between the first and second rigid regions.

18. The method of claim 17, further comprising electrically connecting the first and second dies to the first and second rigid regions, respectively.

19. The method of claim 17, further comprising mounting a plurality of dies over at least a portion of the first die to form a die stack.

20. The method of claim 19, further comprising electrically connecting the plurality of dies and the first die together.

* * * * *